United States Patent [19]

Culp

[11] Patent Number: 5,350,966
[45] Date of Patent: Sep. 27, 1994

[54] PIEZOCELLULAR PROPULSION

[75] Inventor: Gordon W. Culp, Van Nuys, Calif.

[73] Assignee: Rockwell International Corporation, Seal Beach, Calif.

[21] Appl. No.: 124,677

[22] Filed: Sep. 23, 1993

Related U.S. Application Data

[63] Continuation of Ser. No. 790,787, Nov. 12, 1991, abandoned.

[51] Int. Cl.⁵ .......................................... H01L 41/08
[52] U.S. Cl. ................................................... 310/328
[58] Field of Search ................................. 310/328, 800

[56] References Cited

U.S. PATENT DOCUMENTS

| | | | |
|---|---|---|---|
| 3,743,446 | 7/1973 | Mandraian | 310/322 |
| 3,816,774 | 6/1974 | Ohnuki et al. | 310/800 |
| 4,363,991 | 12/1982 | Edelman | 310/316 |
| 4,404,490 | 9/1983 | Taylor et al. | 310/800 |
| 4,423,768 | 1/1984 | Edelman et al. | 310/800 |
| 4,461,179 | 7/1984 | Holt | 310/800 |
| 4,578,613 | 3/1986 | PosthumadeBoer et al. | 310/800 |
| 4,607,254 | 8/1986 | Carlson | 340/606 |
| 4,808,084 | 2/1989 | Tsubouchi et al. | 310/328 |
| 4,812,698 | 3/1989 | Chide et al. | 310/330 |
| 4,868,447 | 9/1989 | Lee et al. | 310/328 |
| 4,952,832 | 8/1990 | Imai et al. | 310/313 |
| 5,001,382 | 3/1991 | Umeda et al. | 310/328 |
| 5,034,649 | 7/1991 | Chida et al. | 310/332 |

OTHER PUBLICATIONS

The Measurement of the Shear Piezoelectric Coefficients of Polyvinylidene Fluoride, *Ferroelectrics*, 1986, vol. 67, pp. 137-141.

*Primary Examiner*—Thomas M. Dougherty
*Attorney, Agent, or Firm*—H. Fredrick Hamann; Harry B. Field; Steven E. Kahm

[57] ABSTRACT

A piezocellular force generating and acoustic interacting device comprising a multiplicity of electrodeformable membranes under semi-autonomous cellular control that directly converts electrical energy into fluid energy by membrane bending, directs thrust by concerted cell actions, and ameliorates friction by passively and actively complying with, and adding fluid to, a boundary layer. The device also provides useful passive and active acoustic fluid interactions.

13 Claims, 2 Drawing Sheets

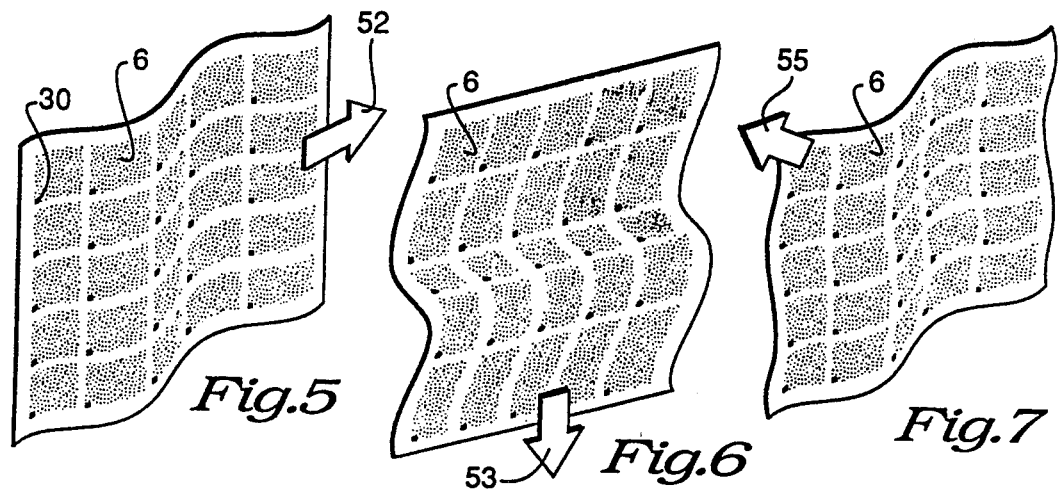
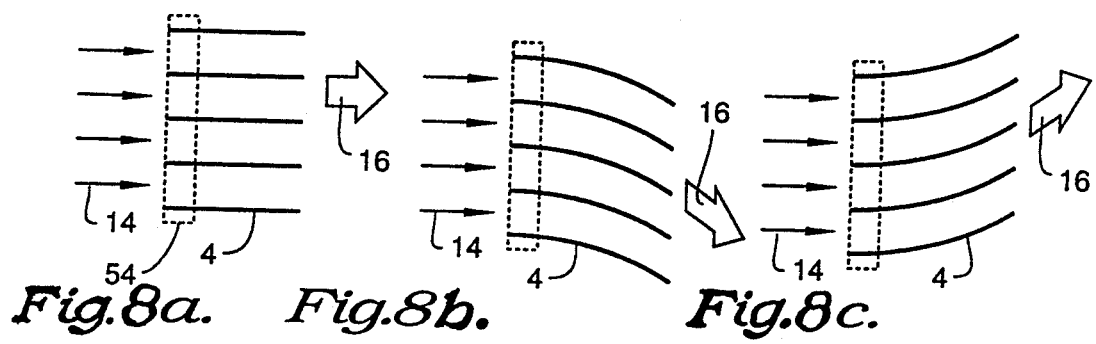
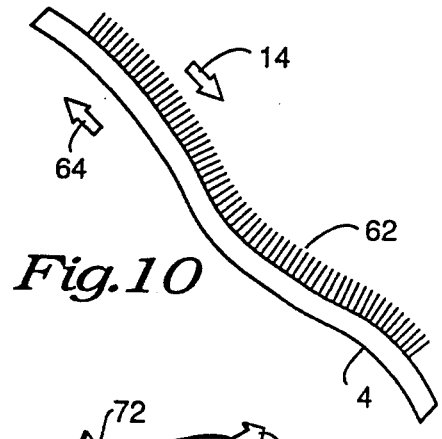
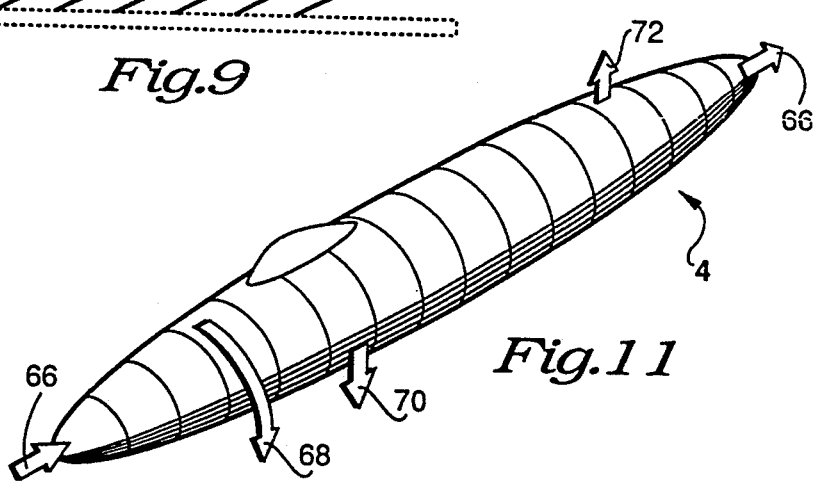

PIEZOCELLULAR PROPULSION

This is a continuation of copending application Ser. No. 07/790,787 filed on Nov. 12, 1991 now abandoned.

BACKGROUND OF THE INVENTION

Traditional propeller and liquid jet propulsion means accelerate a small portion of fluid to relatively high velocity because they transfer mechanical and fluid forces through the hull, and it is advantageous to minimize the size of hull penetrations to ease sealing. The relatively high energy density of these propulsion means favors turbulence that wastes power and creates noise. Additional complexities are required to direct the thrust of traditional propulsion means, usually requiring rudders, steering vanes, rotating fluid unions and the like. High energy density necessitates strong and therefore heavy power transmission components that exacerbate payload and buoyancy problems.

Most propulsion power sources are thermal devices that have higher efficiency when energy density is higher, but have small, highly stressed, and rapidly accelerated mechanical components. Thermal device efficiency generally degrades with delocalization because efficiency is closely related to temperature difference. Accelerating components are inherently acoustically noisy. Conventional hulls have a surface acoustic impedance sufficiently different from that of water that they are excellent sound reflectors. The high energy density renders conventional propellers acoustically noisy, particularly in shallow water. In addition, most propellers are single point catastrophic failure sites. Secondary outer hulls have been used to enhance vessel puncture and explosives protection. The weight, and the increased drag of bulklet outer hulls are penalties of puncture protection because the outer hull contributes nothing to the propulsion and guidance functions.

In contrast to traditional marine propulsion schemes, most aquatic animals have delocalized propulsion with low energy density. Aquatic mammals achieve very rapid acceleration by obviating much of the friction on their wetted surfaces, through compliance with the fluid, and by adding other fluids to the boundary layer. Eels and needle fish use traveling wave fins, while the variety of protozoan locomotion mechanisms seems without bound. Protozoa typically use traveling waves of the outer cell membrane, some with and some without augmenting cilia. Usually the entire external, and in some cases, internal surfaces are covered with propulsion and steering means. Thrust derived from moving body structures is easily directed by sending several different appropriate messages. Messages received by the body structures then elicit other messages, completing the propulsion act with little further effort by the animal. Efficient propulsion methods evolved in animals because they depended entirely on relatively slow metabolism. Their propulsion is quiet because noise wastes energy, and wasted energy eventually vitiates a species.

The following describes piezocellular propulsion that in part emulates natural processes.

SUMMARY OF THE INVENTION

The piezocellular propulsion device is an immersed multiplicity of curving electrodeformable membranes under semi-autonomous cellular control that directly converts electrical energy into fluid energy by traveling waves. The device directs thrust by curving membranes, sending waves in particular directions, and ameliorates friction by passively and actively complying with and adding fluid to a boundary layer. The device senses fluid flow conditions and modifies its actions to optimize a desired combination of efficiency and quiet operation. Additionally, membranes sense, amplify, attenuate, cancel, and transmit acoustic signals. Semi-autonomous control simplifies communication with an external command source. The present invention is primarily directed toward quiet propulsion, attitude control, and hull protection of marine vessels. The device may fully fill propulsion and steering functions, may assist at low speeds when a conventional propulsion system is less effective, or may serve as a quieting and efficiency enhancing adjunct to conventional propulsion means, particularly ducted means.

BRIEF DESCRIPTION OF THE DRAWINGS

FIGS. 5, 6 and 7 show one membrane thrusting in three of many possible directions.

FIG. 8($a$–$c$) shows thrust vectoring in three directions by membrane bending.

FIG. 9 shows boundary layer interaction with bending end membranes.

FIG. 10 shows a variant having ciliate excrescences augmenting boundary layer control.

FIG. 11 shows the effect on a vessel covered with piezocellular propulsion material.

OBJECTS OF THE INVENTION

An object of the present invention is to provide aquatic piezocellular directed thrust, attitude control, and boundary layer drag reduction by detection, analysis and response to fluid flow conditions, passive surface compliance, active surface compliance, boundary layer dilution, and controlled motion of ciliate excrescences.

Another object of the present invention is to provide aquatic piezocellular acoustic emission reduction by chaotic propulsion action, passive sound attenuation by absorption and scattering, transmitted interior sound detection and analysis, active sound cancellation, and energy density reduction by action delocalization.

Yet another object of the present invention is to provide aquatic piezocellular acoustic reflection reduction by passive sound attenuation by absorption and scattering, matching fluid acoustic impedance, impinging external sound detection and analysis, active sound cancellation, and creation of acoustic fields.

Still another object of the present invention is to use semi-autonomous cells to simplify internal command and power wiring, communications with external control command sources, and further simplify power wiring with external power sources.

Another object of the invention is to provide directed sound transmission by time domain sequencing.

Another object of the invention is to provide tolerance to faults due to damage and failures by means of cell autonomy and self-sensing.

Still another object of the invention lies in the attainment of near neutral buoyancy.

One other object of the present invention is to provide augmented hull explosion and puncture protection without a conventional outer hull.

DETAILED DESCRIPTION

Figure 1:
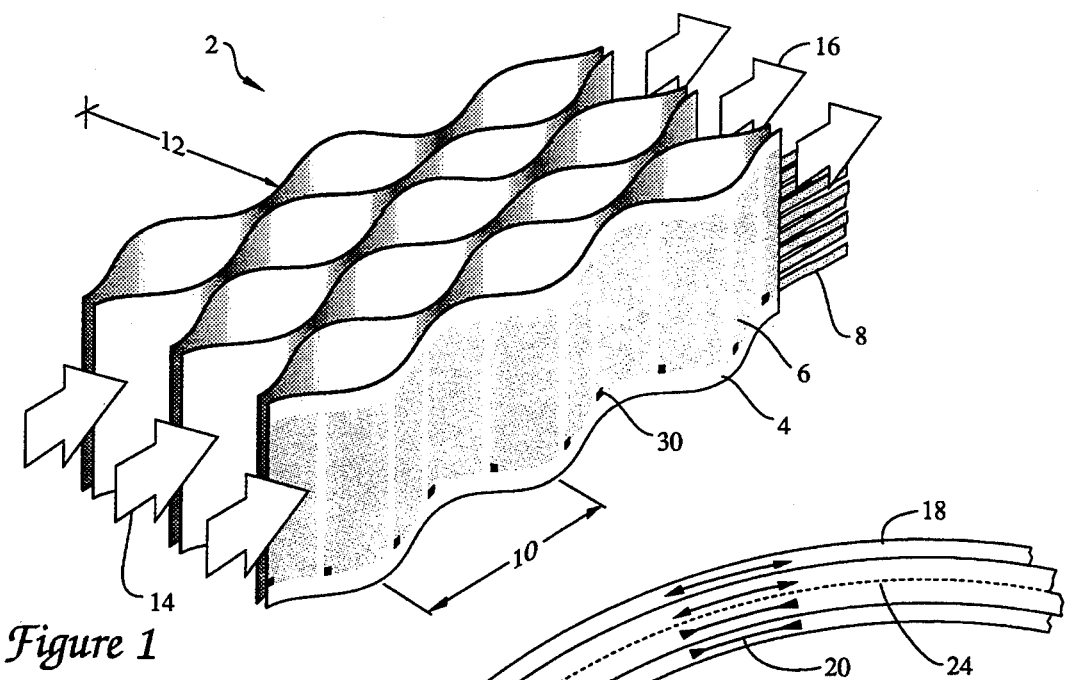
FIG. 1 is a perspective view of a portion of piezocellular propulser.

Referring to FIG. 1, shown generally as 2 is a portion of the preferred embodiment of the propulsion function of the present invention which is an electrodeformable piezoelectric polarized polyvinylidene fluoride membrane 4 comprising semi-autonomous cells, each cell further comprising at least two electrodes 6, controller 30, and connection means 8 to external sources of electrical power and control signals (not shown). On receipt of a propulsion command, controllers 30 apply time alternating electric potentials to electrodes 6 to cause membrane curves. For example, concerted cell actions may form traveling waves. Fluid between membranes moves with traveling waves from inlet 14 to outlet 16.

Electric field intensity, cell dimensions, and piezoelectric membrane materials properties determine curve radius 12, while the cell period and the controller commands determine the wavelength 10. Fluid resistance, membrane tension, wavelength and curvature determine the wave amplitude. Waves of adjacent membranes, given enough wave amplitude and sufficiently small spacing, divide intervening fluid streams into packets which tend to adopt the same velocity as the group velocity of the traveling waves. Fluid becomes more packetized in a long fluid path. Packets may be gradually accelerated to higher speeds near the fluid exit than at the fluid inlet. Propulsion forces are passed to the bearing vessel by support structure (not shown for clarity).

Figure 2:
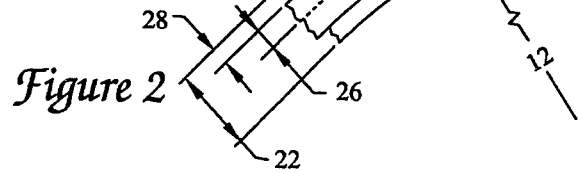
FIG. 2 schematically shows a cross section of piezoelectric membrane.
Figure 3:
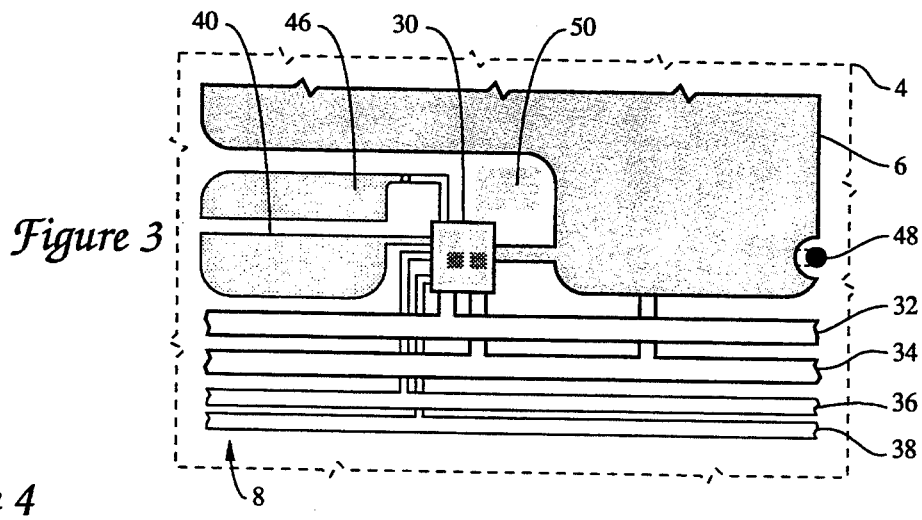
FIG. 3 is an enlarged plan portion view showing a semiautonomous cell.
Figure 4:
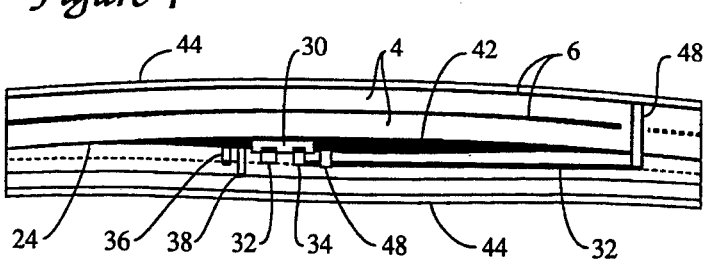
FIG. 4 is a cross section enlarged view of FIG. 3.

As shown in FIGS. 2-4, membrane 4 is a multilayer electrical laminate with interlayer connectors 48. Variants have conductors on both sides of each layer with fewer interlayer connections. Membrane 4 may be any flexible electrodeformable material, particularly polyvinylidene floride (PVDF), a piezoelectric polymer. Without restraint, PVDF extends 10 to 20 pm/volt, shears 30 to 40 pm/volt, and causes a pyroelectric potential difference of about 10 volts per Centigrade degree temperature change.

As noted above, a piezoelectric lamination of polymer 18, for example, oriented and polarized PVDF, with four layers, each having electric potential applied to broad surface electrodes so that the top two layers expand while the bottom two layers contract under the electric influence, indicated by arrows 20. Neutral fiber 24 undergoes no expansion or contraction but is subjected to maximum shear stress during operation. Neutral fiber 24 and external surfaces have grounded electrodes, while the other internal electrodes receive electric charge of appropriate polarity and timing. The noted expansion and contraction, by dint of the layers being bonded together, cause the laminate to curve with radius 12. The magnitude of curvature (the inverse of radius 12) depends in part on the intensity of the applied electric fields, which in turn depend on the thickness of the layers 26, 28. The thickness of layer 28 may be less than that of layer 26 because layer 28 must deform more with the same electric potential applied to both. Overall thickness 22 determines in part the magnitude of force the membrane can exert on the immersing fluid. Curvature also obtains when piezoelectric layers are shear polarized at an angle to the direction of the applied electric field.

FIG. 3 shows with greater detail an enlarged plan portion of a typical cell of membrane 4 comprising curve electrodes 6, heater 50, temperature sensor 46, and strain or force sensor 40. Temperature sensor 46 consists of electrodes responsive to potentials generated by the membrane material. The membrane embodiment having pyroelectric material produces electrical potentials representative of a change of membrane temperature. Intercell electrical connections and electrical connections to an external signal and power source (not shown) are generally indicated by 8, comprising leads for power 32, power ground 34, signal ground 36, and signal lead 38. An alternate embodiment of the present invention has signal connections 36, 38 and inter-cell communication links which are photonic rather than electrical. Photonic links include optical fibers, optical wave guides embedded into membrane layers, and radiation transmitters and receivers which may be incorporated into controllers.

Heater 50 and temperature sensor electrodes 46 spaced distance d from heater 50, constitute a fluid velocity sensor. For example, fluid flowing from right to left in FIG. 3 places electrodes 46 in the lee of heater 50. A current pulse in heater 50 warms a fluid portion to temperature T. Membrane material proximate electrodes 46 creates a pyroelectric potential E which is measured at time t by controller 30. Controller 30 thereby determines fluid velocity by calculating the quotient d by t. A variant sensor surrounds electrodes 46 by an annular heater spaced by distance d, constituting an omnidirectional fluid velocity sensor. An alternative embodiment of the velocity sensor surrounds the heater with annular electrodes. The choice of annular heater or electrode follows the requirements of a particular application.

A preferred membrane material is electrodeformable and electromechanically reciprocal, namely, one which transduces with equivalent alacrity from mechanical to electrical, as well as from electrical to mechanical. Force sensor electrodes 40, FIG. 3, use the reciprocal property to detect electric charge representative of an applied force, such as a bending strain in the membrane. Equivalently, in the case of shear-responsive electrodeformable reciprocal material, fluid forces induce shear strains in the membrane with a similar electrical effect. Controller 30 uses the strain signal to determine the instantaneous state of interaction between membrane and fluid, and therefore the desired operating mode of curve electrodes 6.

Practical embodiments of cellular propulsion require a large number of cells, which, if individually commanded and powered, would be slow to respond as well as having an impractically large cable bundle. Semiautonomous cells, only a few of which are commanded, greatly simplify and speed up communications between cells and an external command source, and between the cells themselves.

Controller 30 contains circuits to store commands, to collect and analyze sensor data, to receive and issue subordinate intercellular commands, and to exchange status data with other cells as well as with an external command source. Operating a cell commences with the receipt by controller 30 of a command, for example, on lead 38, that is addressed to that cell, commands addressed to other cells being ignored. The command is stored for execution at a later time or executed immediately as prescribed by the type of command. Externally supplied commands are executed in combination with endemic commands, such as those commands permanently or temporarily stored in the controller.

A command commonly contains instructions for a selected cell to autonomously command neighboring subordinate cells. The neighboring cells, although subordinate, may send status messages to the controlling cell that may effect the execution of subsequent commands.

The piezocellular system is tolerant to faults and failures. Each controller contains stored commands to self-deactivate when weakness or dysfunction occurs. When an isolated cell is deactivated, the adverse effect on performance is largely mitigated by the large number of cells. A self deactivating cell reassigns control responsibility to a neighboring cell and informs the external command source. Alternatively, the occurrence and location of a cell failure may be archived by a surviving cell which is later queried by the external command source.

FIG. 4 shows a cross section of FIG. 3. Embedding material 42 reduces stress concentration on controller 30. Barrier layers 44 exclude fluid vapors to prevent shorting and corrosion. Embodiments of the invention are not limited to the illustrated configuration. For example, thicker membranes are used to generate greater fluid forces, a greater number of electrically paralleled, and more numerous but thinner electrodeformable layers permit force generation using lower electrical potentials. Controllers may control greater numbers of curve electrodes, sensors and the like than illustrated.

Controller 30 may be a separate chip, a monolithic integrated circuit, or a hybrid. The preferred embodiment uses epitaxially applied thin film integrated circuits similar to those used in flat panel displays. The thickness of the controller is greatly exaggerated in the figures. Controller elements are flexible in the context of the large curve radius (12, FIG. 1), and are economically applied in a continuous strip process.

FIGS. 5, 6 and 7 show respective directions of propagation of traveling waves laterally 52, vertically downward 53, diagonally 55, and in any other direction depending on the commands being executed, such as by controller 30 and electrodes 6. Externally supplied instructions also elicit traveling waves of predetermined amplitude and of any desired wave shape, provided cell spatial frequency is greater than wave frequency. Wave properties may vary with time and with distance from a local origin.

FIG. 8 shows three edge views of end cell cantilevered portions of membranes 4 which are supported by structure 54. Structure 54 supplies necessary reaction forces for membranes 4 but minimally hinders fluid flow from fluid inlet 14 to fluid outlet 16. External instructions cause end controllers to straighten membranes 4 as in FIG. 8a, curve them upward as in FIG. 8c, or curve them downward as in FIG. 8b to effect thrust direction, also called thrust vectoring. Membrane cells upstream of support 54 may also be curved to add to the effectiveness of thrust vectoring.

FIG. 9 shows membrane ends 4 in porous structural support 54. Fluid passes over the membrane surface indicated by the hollow arrow. Large membrane curvature provides a relatively closed but compliant boundary layer surface while smaller curvature 56 allows other fluid 14 to mix with the boundary layer, thereby reducing flow drag. Electrically varying membrane curvature 58 adds active boundary layer compliance to the inherent passive compliance to better accommodate non-steady fluid flow. When analyzed force sensor data of the cells are used to determine membrane compliance responses, non-steady boundary flow is accommodated with less friction. Immersing fluid generally flows at an angle to the membranes and any fluid therebetween borne. Fluid from between membranes may be mixed with and share momentum with immersing fluid, thereby altering the energy content of angularly disposed mixed fluid.

FIG. 10 shows membrane 4 having a surface comprising a multiplicity of ciliate excrescences 62. Cilia motion is controlled by membrane motion to augment propulsive effects, a process well demonstrated by protozoa. Cilia motion in direction 14, in the direction of fluid flow, exerts a force in direction 64 on the membrane. Cilia modify the interaction of acoustic perturbations with the membrane, including alteration of the apparent acoustical impedance, reflectivity, and absorptivity.

FIG. 11 schematically shows a submersible vessel having an external surface at least partially clothed with piezocellular propulsion membranes 4 generally indicated as lines thereon which have received command messages and are in the process of selective execution such that axial thrust 66 propels the vessel, rotary force 68 tends to roll the vessel about its long axis, downward force indicated by arrow 70 is superimposed on the other forces, and upward force at the location indicated by arrow 72 is similarly acting. Not needed are rudders, fins, keels, stabilizing vanes, propellers and pivoted jets. All but the latter are ineffectual at zero or very low speeds, while piezocellular means are fully effective at any speed within their range of speeds, including station keeping. Piezocellular propulsion controls to some extent the apparent buoyancy of a vessel, and is also very effective in attitude control because forces applied at vessel extremities generate the largest possible moments, given a force, for that vessel. Unlike a rudder, piezocellular coverings are not shrouded by hull portions and behave in a more predictable manner than control surfaces which are influenced by local fluid dynamic conditions.

Piezocellular propulsion accelerates a large fraction of the interacting fluid to only a slightly greater velocity than the vessel's general velocity. Acceleration is very gentle, for example, when using the entire length of the vessel from bow to stern to impart a desired fluid velocity change. Cilia increase the effectiveness of propulsion in some applications wherein the fluid friction of the boundary layer enhances the propulsive effect, while the cilia themselves in part remove the drag force from the boundary layer. The advantage of cilia may be compared to conventional vessels, in which the friction of all but the propulsive wetted area is a large, passive, constant source of drag and power dissipation.

A marine vessel partially or completely covered by piezocellular material has a fluid contact and interaction area very much larger than the area of the conventional rotating propeller or water jet. Propulsive energy density decreases proportionally with inverse surface area, given a fixed available power. Low energy density favors laminar rather than turbulent fluid flow. Turbulence energy becomes heat instead of contributing to propulsion, thus reducing propulsion efficiency.

Low energy density also reduces the maximum pressure on propelling surfaces proportionally with inverse surface area. Low propulsion pressure affords thinner structures than in conventional propulsion components. Thinner membranes allow a greater bending curvature with a given applied potential. In addition, thin membranes favor high electrical efficiency because less elastic bending energy is stored in the membranes during traveling wave operation. Mechanical efficiency of propulsion is increased by the reduced fluid flow resistance of slender supporting structures.

Acoustic conditions are important in many marine applications. Acoustic emanations from high energy density propulsion allow relatively easy vessel detection and location. In addition, turbulence, especially from fluid passing an edge, is usually periodic and radiative. Internal noise from high energy density machinery contributes to the broadcast noise spectrum and interferes with passive sound detection. The high density and elastic modulus of hull materials poorly match the acoustic impedance of water, providing higher than desired acoustic reflectivity. Vessels other than those with double hulls are more prone to damage from puncture and explosions.

Piezocellular propulsion materials provide partial and in some cases complete solutions to these problems. A piezocellular covering is substantially thicker than the skin of a vessel and adds protection from explosions and puncture, obviating a redundant hull. Many oriented polymer films, PVDF among them, have high strength to weight ratios and act as armor. Prior art methods add pores to polymer membranes to adjust impedance closer to that of water.

Delocalized propulsion and the concomitant reduction in energy density previously described greatly reduces acoustic noise emission by not causing it. Electrical sources interior to the vessel may be inherently quiet or acoustically isolated as required. Transfer of electrical power is quieter than transmitting mechanical power through a hull, and static seals are quieter and more reliable than sliding ones.

Noise may be attenuated in a passive manner by a piezocellular covering through absorption and scattering. Additional attenuation is provided by cilia. In addition, piezocellular propulsion materials provide active noise attenuation. Referring again to FIG. 3, pressure sensor 40 and temperature sensor 46 are usable as high frequency microphones, while curve electrodes 6, having a larger area, serve as low frequency microphones. The electrodes of a subset of cells may, in selected embodiments, be used as a collective phased array microphone or hydrophone of great sensitivity. Controllers calculate the complement of an acoustic disturbance using hydrophone signals, then command one or more electrodes to cancel it. The direction of a disturbance is determined using computations in the time domain after two or more neighboring cells have made measurements. Complements may be derived for cells sufficiently downstream of the sensing cells to allow time for complement calculations. A vessel completely clothed in piezocellular materials may appear essentially transparent to external impinging acoustic disturbances. Internal noise is canceled in a similar manner.

The piezocellular covering of FIG. 11 may have primary fluid inlets at the bow and primary outlets at the stern to optimize forward propulsion. In other applications inlets and outlets may be scattered essentially uniformly over the entire covered surface. The latter reduces exterior surface drag by sucking in about half the boundary layer fluid while diluting the other half with propelled water. Another benefit of delocalized inlets and outlets is lower bulk differential velocity, making Doppler detection much more difficult.

Using reciprocity, sensors and curve electrodes of piezocellular material are also used as a phased array sonar transmitter, although the temperature sensor is connected to a high impedance pyroelectric signal amplifier and is used as an acoustic transmitter having low efficiency. As described for piezocellular propulsion, a few predetermined cells issue subordinate acoustic commands to increase communications responsiveness. The sound cancellation and transmission functions may also be made completely autonomous and independent of an external command source.

A submerged vessel in the path of an acoustic pulse from a distant source may avoid detection by cancelling the pulse. However, complete cancellation creates a sound shadow which is detectable by known means. The sound shadow is called an umbra when devoid of source sound, and a penumbra in portions of the sound shadow that contain varying strengths of source sound. Detection is avoided by umbral and penumbral reconstruction, wherein the nature of the impinging sound pulse is determined by cellular analyses on the impinged side of the vessel, cancelled or otherwise prevented from reflecting, and the transmissive mode of the shadowed membrane portion is instructed to fill the shadow with a sound pulse which closely resembles that of the distant source.

Piezoelectric polymers have specific gravities comparable to water. Piezocellular propulsion is therefore substantially lighter than conventional propulsion components. Previously mentioned prior art foamed piezoelectric polymers are used to reduce piezocelular propulsion density. Reduced density increases payload and overall system efficiency. The trend toward neutral density in sea water is continued by the piezocellular propulsion of the present invention.

Propulsion noise is least detectable when concerted cell actions are asynchronous or chaotic so that acoustic emissions are partitioned into many frequency bands. The energy content of each band is reduced inversely with the number of bands. Acoustic detectability of piezocellular propulsion is made arbitrarily more difficult by sufficient energy partitioning, in addition to the previously described energy density reduction by propulsion delocalization.

What is claimed is:

1. A fluid forcing and acoustical interaction device comprising:
   a support;
   a plurality of membranes, each membrane having a front end, a back end and two opposing surfaces, the front end attached to the support, the membranes having;
   a plurality of electrodeformable cells, each cell having;
   a least one layer of electrodeformable material which changes length in response to an applied electric potential, thereby bending the membrane as a function of the potential applied;
   a means of applying a potential to each cell to produce movement of each cell;
   a means of controlling the potential applied to each cell to yield a coordinated wave motion of the membranes, whereby the membranes are immersed in a fluid and the wave motion of the membrane's opposing surfaces interact with the fluid.

2. A fluid forcing and acoustical interaction device as in claim 1 wherein, the membranes are controlled for form traveling waves.

3. A fluid forcing and acoustical interaction device as in claim 2 wherein, the membranes have cilia attached to at least one surface to increase the propulsive force of the traveling wave in a fluid.

4. A fluid forcing and acoustical interaction device as in claim 2 wherein, the traveling waves of adjacent membranes immersed in a fluid are coordinated to form packets of fluid which are moved from the front end to the back end of the membrane.

5. A fluid forcing and acoustical interaction device as in claim 1 wherein, the back end of the membranes are controlled to be uniformly curved in the same direction to act as steering vanes for a flowing fluid.

6. A fluid forcing and acoustical interaction device as in claim 1 wherein, each cell has a means for sensing fluid flow, for detecting the speed of a fluid flowing adjacent to the cell.

7. A fluid forcing and acoustical interaction device as in claim 1 wherein, each cell has a means for sensing fluid pressure to measure a fluid pressure adjacent to the cell.

8. A fluid forcing and acoustical interaction device as in claim 1 wherein, each cell has a means of sensing strain to measure how far the cell has been bent.

9. A fluid forcing and acoustical interaction device as in claim 6 wherein, each cell has a means for sensing fluid pressure to measure a fluid pressure adjacent to the cell.

10. A fluid forcing and acoustical interaction device as in claim 9 wherein, each cell has a means of sensing strain to measure how far the cell has been bent.

11. A fluid forcing and acoustical interaction device as in claim 1 wherein, the membranes are controlled to produce an acoustic wave of a desired frequency.

12. A fluid forcing and acoustical interaction device as in claim 1 wherein, each cell has a means of measuring impacting acoustic waves for use as a sonar detector.

13. A fluid forcing and acoustical interaction device as in claim 1 wherein, there is a means for detecting the pressure differentials in a fluid flow and adjusting the position of the membrane relative to the pressure differences in the fluid to reduce drag between the membranes and the fluid as the fluid flows by.

* * * * *